(12) United States Patent
Kashiwagi

(10) Patent No.: US 11,335,588 B2
(45) Date of Patent: May 17, 2022

(54) SUBSTRATE HOLDING APPARATUS AND SUBSTRATE PROCESSING APPARATUS

(71) Applicant: EBARA CORPORATION, Tokyo (JP)

(72) Inventor: Makoto Kashiwagi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/898,771

(22) Filed: Jun. 11, 2020

(65) Prior Publication Data

US 2020/0402835 A1 Dec. 24, 2020

(30) Foreign Application Priority Data

Jun. 18, 2019 (JP) .............................. JP2019-112675
Dec. 16, 2019 (JP) .............................. JP2019-226437

(51) Int. Cl.
*H01L 21/687* (2006.01)
*H01L 21/67* (2006.01)

(52) U.S. Cl.
CPC .. *H01L 21/68764* (2013.01); *H01L 21/67253* (2013.01); *H01L 21/68785* (2013.01); *H01L 21/68792* (2013.01)

(58) Field of Classification Search
CPC ......... H01L 21/68764; H01L 21/68792; H01L 21/68785
See application file for complete search history.

(56) References Cited

U.S. PATENT DOCUMENTS

| 4,621,459 A | 11/1986 | Stump et al. | |
|---|---|---|---|
| 2016/0096205 A1* | 4/2016 | Kato | H01L 21/68792 |
| | | | 134/21 |
| 2017/0236303 A1 | 8/2017 | Sano | |
| 2018/0015508 A1* | 1/2018 | Ishii | H01L 21/67051 |
| 2018/0277417 A1* | 9/2018 | Ishii | H01L 21/68728 |
| 2019/0035622 A1* | 1/2019 | Shibayama | B08B 3/10 |
| 2019/0118335 A1* | 4/2019 | Kobayashi | B24B 37/105 |
| 2019/0131166 A1* | 5/2019 | Kashiwagi | H01L 21/68764 |
| 2020/0066549 A1* | 2/2020 | Ishibashi | H01L 21/6704 |
| 2020/0391259 A1* | 12/2020 | Shin | H01L 21/68728 |
| 2020/0402835 A1* | 12/2020 | Kashiwagi | H01L 21/68728 |

FOREIGN PATENT DOCUMENTS

| EP | 3272459 A1 | 1/2018 |
|---|---|---|
| EP | 3477393 A1 | 5/2019 |
| JP | 2019-083224 A | 5/2019 |
| WO | WO 2012/074458 A1 | 6/2012 |
| WO | WO 2015/113591 A1 | 8/2015 |
| WO | WO 2018/008343 A1 | 1/2018 |

OTHER PUBLICATIONS

European Patent Application No. 20180334.3; Extended Search Report; dated Oct. 2, 2020; 9 pages.

* cited by examiner

*Primary Examiner* — Kaitlin S Joerger
(74) *Attorney, Agent, or Firm* — BakerHostetler

(57) ABSTRACT

A substrate holding apparatus which can stably hold a substrate, such as a wafer, while causing the substrate to make a circular motion and rotating the substrate about its axis is disclosed. The substrate holding apparatus includes: rollers; electric motors configured to rotate the rollers; eccentric shafts arranged around a central axis; and actuators. The eccentric shafts include movable shafts and reference shafts, the actuators are coupled to the movable shafts, respectively, and the actuators are configured to move the movable shafts in a direction closer to the reference shafts and in a direction away from the reference shafts.

13 Claims, 12 Drawing Sheets

SUBSTRATE HOLDING APPARATUS AND SUBSTRATE PROCESSING APPARATUS

CROSS REFERENCE TO RELATED APPLICATION

This document claims priorities to Japanese Patent Application Number 2019-112675 filed Jun. 18, 2019 and Japanese Patent Application Number 2019-226437 filed Dec. 16, 2019, the entire contents of which are hereby incorporated by reference.

BACKGROUND

Devices, such as memory circuits, logic circuits, and image sensors (e.g., CMOS sensors), are becoming more highly integrated these days. In a process for forming such a device, foreign matters (e.g., fine particles and dust) may adhere to the device. Foreign matters adhering to a device can cause a short-circuit between interconnects or a circuit defect. Therefore, in order to enhance the reliability of the device, it is necessary to clean a wafer on which the device is formed to remove the foreign matters from the wafer.

The above-described foreign matters, such as fine particles and dust, may adhere also to a back surface (bare-silicon surface) of a wafer. If such foreign matters adhere to the back surface of the wafer, the wafer may separate from a stage reference surface, or a front surface of the wafer may be inclined with respect to the stage reference surface in an exposure apparatus, resulting in patterning shift or deviation of focal distance. To prevent such problems, it is necessary to remove foreign matters adhering to a back surface of a wafer.

There has recently been an increasing demand for an apparatus which can more efficiently process an entirety of a substrate surface. Therefore, a substrate holding apparatus has been proposed in which a periphery of a substrate is held by rollers coupled to eccentric shafts, and the substrate is rotated about its own axis while the substrate is made a circular motion by rotating the eccentric shafts about their axes, with positions of the eccentric shafts themselves remain stationary (for example, see Japanese Laid-Open Patent Publication No. 2019-83224).

In a substrate processing apparatus using such a substrate holding apparatus, a processing tool can process the entirety of the surface, including its outermost area, of the substrate while preventing the rollers from coming into contact with the processing tool. The combination of the circular motion of the substrate and the rotation of the substrate about its axis can increase the speed of the substrate at any point on the surface of the substrate. As a result, an efficiency of processing of the substrate can be improved.

In such a substrate holding apparatus, it is necessary to synchronize phases of the eccentric shafts with each other. However, it is difficult to accurately synchronize the phases of the eccentric shafts, and a vibration may occur in the eccentric shafts during rotation of the substrate due to phase shift. When the vibration occurs in one of the eccentric shafts, the vibration may propagate to other eccentric shafts via a common support plate that supports these eccentric shafts, thus causing unstable holding of the substrate.

SUMMARY OF THE INVENTION

Therefore, there is provided a substrate holding apparatus which can stably hold a substrate, such as a wafer, while causing the substrate to make a circular motion and rotating the substrate about its axis. In addition, there is provided a substrate processing apparatus for processing a surface of a substrate with use of such a substrate holding apparatus.

Embodiments, which will be described below, relate to a substrate holding apparatus for holding and rotating a substrate, such as a wafer. Embodiments, which will be described below, also relate to a substrate processing apparatus having such a substrate holding apparatus.

In an embodiment, there is provided a substrate holding apparatus configured to rotate a substrate about its axis while causing the substrate to make a circular motion, comprising: rollers capable of contacting a periphery of the substrate; electric motors configured to rotate the rollers; eccentric shafts arranged around a predetermined central axis; and actuators, wherein the eccentric shafts have first shaft portions and second shaft portions, the second shaft portions being eccentric relative to the first shaft portions, respectively, the rollers are fixed to the second shaft portions, respectively, the first shaft portions are coupled to the electric motors, respectively, the eccentric shafts include movable shafts and reference shafts, the actuators are coupled to the movable shafts, respectively, and the actuators are configured to move the movable shafts in a direction closer to the reference shafts and in a direction away from the reference shafts.

In an embodiment, the eccentric shafts further have intermediate shaft portions that couple the first shaft portions to the second shaft portions; the first shaft portions are secured to the intermediate shaft portions, respectively; and the second shaft portions are secured to the intermediate shaft portions, respectively.

In an embodiment, the substrate holding apparatus further comprises an operation controller configured to cause the electric motors to rotate at the same speed with the same phase.

In an embodiment, the direction closer to the reference shafts and the direction away from the reference shafts are a direction toward the central axis and a direction away from the central axis.

In an embodiment, each of the actuators includes: a piston; a housing arranged away from the piston; and a diaphragm which forms a pressure chamber between the piston and the housing.

In an embodiment, the diaphragm includes: a central portion in contact with an end of the piston; an inner wall portion connected to the central portion and extending along a side surface of the piston; a folded-back portion connected to the inner wall portion and having a curved cross section; and an outer wall portion connected to the folded-back portion and located outside the inner wall portion.

In an embodiment, the substrate holding apparatus further comprises at least one non-contact type distance sensor configured to measure a movement distance of at least one of the movable shafts.

In an embodiment, the substrate holding apparatus further comprises an operation controller configured to determine whether or not an abnormality has occurred in the substrate holding apparatus by comparing a measured value of the movement distance or an index value calculated from a plurality of measured values of the movement distance with a preset threshold value.

In an embodiment, the index value is an average value of positions of at least one of the movable shafts when the rollers are making one or more rotations.

In an embodiment, the index value is a difference between a maximum value and a minimum value of positions of at least one of the movable shafts during one or more rotations of the rollers.

In an embodiment, there is provided a substrate holding apparatus configured to rotate a substrate about its axis while causing the substrate to make a circular motion, comprising: rollers capable of contacting a periphery of the substrate; electric motors configured to rotate the rollers; eccentric shafts arranged around a predetermined central axis; and an actuator, wherein the eccentric shafts have first shaft portions and second shaft portions, the second shaft portions being eccentric relative to the first shaft portions, respectively, the rollers are fixed to the second shaft portions, respectively, the first shaft portions are coupled to the electric motors, respectively, the eccentric shafts include a movable shaft and reference shafts, the actuator is coupled to the movable shaft, and the actuator is configured to move the movable shaft in a direction closer to the reference shafts and in a direction away from the reference shafts, and wherein the actuator includes: a piston; a housing arranged away from the piston; and a diaphragm which forms a pressure chamber between the piston and the housing.

In an embodiment, the eccentric shafts further have intermediate shaft portions that couple the first shaft portions to the second shaft portions; the first shaft portions are secured to the intermediate shaft portions, respectively; and the second shaft portions are secured to the intermediate shaft portions, respectively.

In an embodiment, the substrate holding apparatus further comprises an operation controller configured to cause the electric motors to rotate at the same speed with the same phase.

In an embodiment, the direction closer to the reference shafts and the direction away from the reference shafts are a direction toward the central axis and a direction away from the central axis.

In an embodiment, the diaphragm includes: a central portion in contact with an end of the piston; an inner wall portion connected to the central portion and extending along a side surface of the piston; a folded-back portion connected to the inner wall portion and having a curved cross section; and an outer wall portion connected to the folded-back portion and located outside the inner wall portion.

In an embodiment, the substrate holding apparatus further comprises a non-contact type distance sensor configured to measure a movement distance of the movable shaft.

In an embodiment, the substrate holding apparatus further comprises an operation controller configured to determine whether or not an abnormality has occurred in the substrate holding apparatus by comparing a measured value of the movement distance or an index value calculated from a plurality of measured values of the movement distance with a preset threshold value.

In an embodiment, the index value is an average value of positions of the movable shaft when the rollers are making one or more rotations.

In an embodiment, the index value is a difference between a maximum value and a minimum value of positions of the movable shaft during one or more rotations of the rollers.

In an embodiment, there is provided a substrate processing apparatus comprising: the substrate holding apparatus described above; and a processing head configured to bring a processing tool into contact with a first surface of a substrate to process the first surface.

According to the present invention, the movable shafts are coupled to the actuators, respectively, and are not supported by a common support plate. Such configuration can prevent vibration, which may occur in one of the movable shafts during rotation of the substrate, from propagating to other movable shafts. As a result, the substrate holding apparatus can stably hold the substrate.

Further, according to the present invention, since the housing of the actuator is arranged away from the piston, no sliding resistance is generated between the piston and the housing. As a result, the substrate holding apparatus can stably hold the substrate without exerting an excessive load on the substrate.

DESCRIPTION OF EMBODIMENTS

Figure 1:
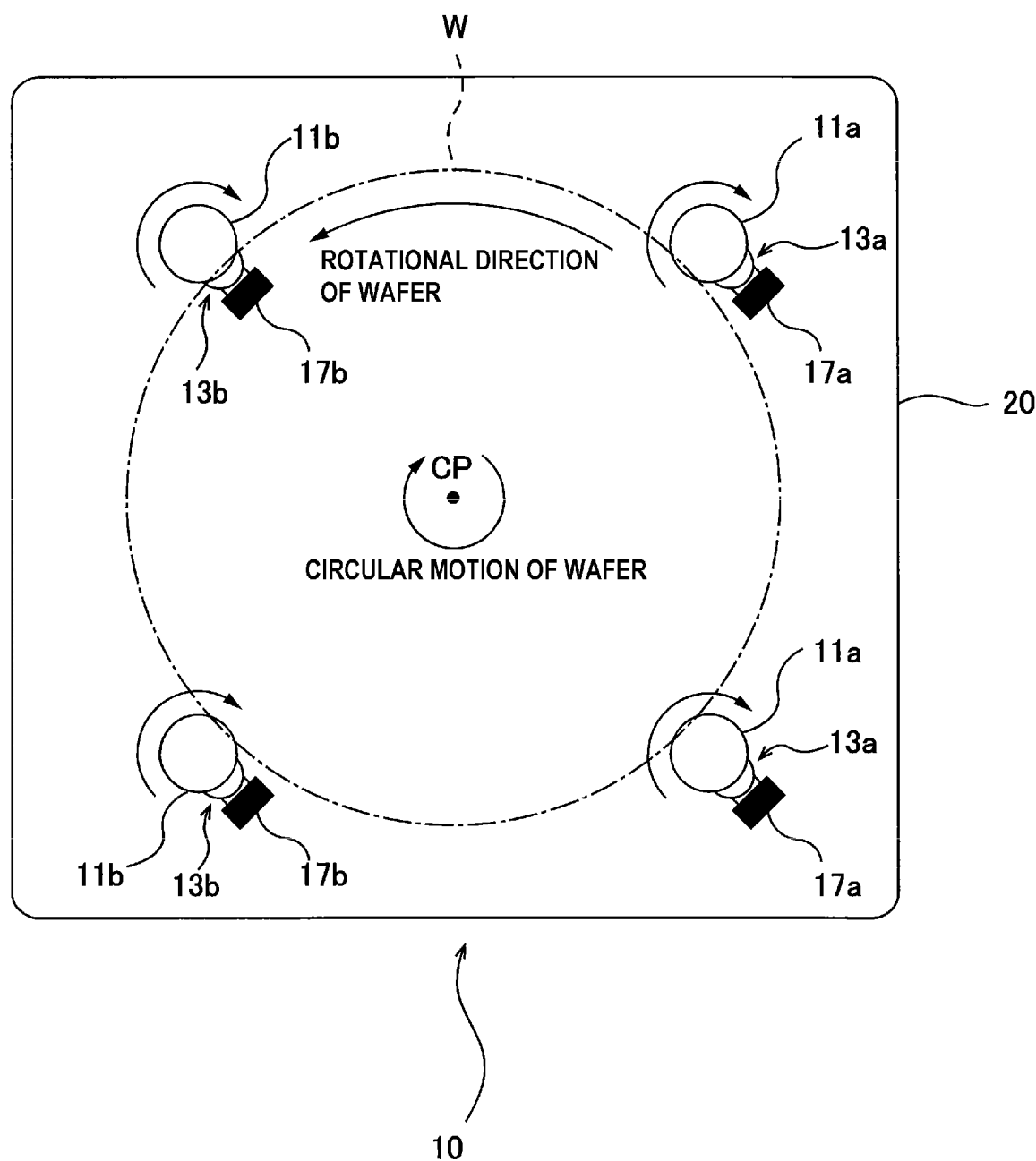
FIG. 1 is a plan view schematically showing an embodiment of a substrate holding apparatus.
Figure 2:
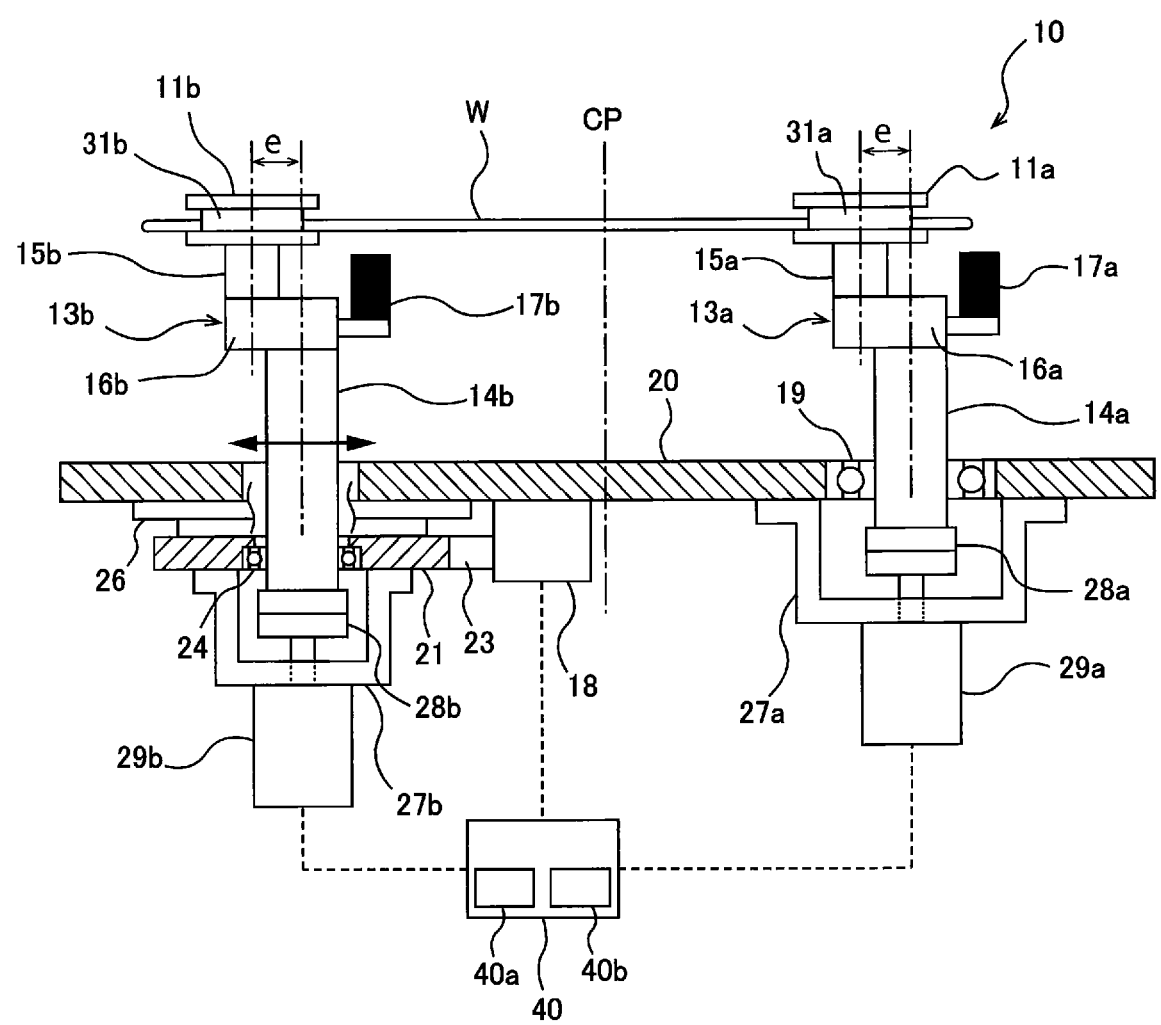
FIG. 2 is a side view of the substrate holding apparatus shown in FIG. 1.
Figure 3:
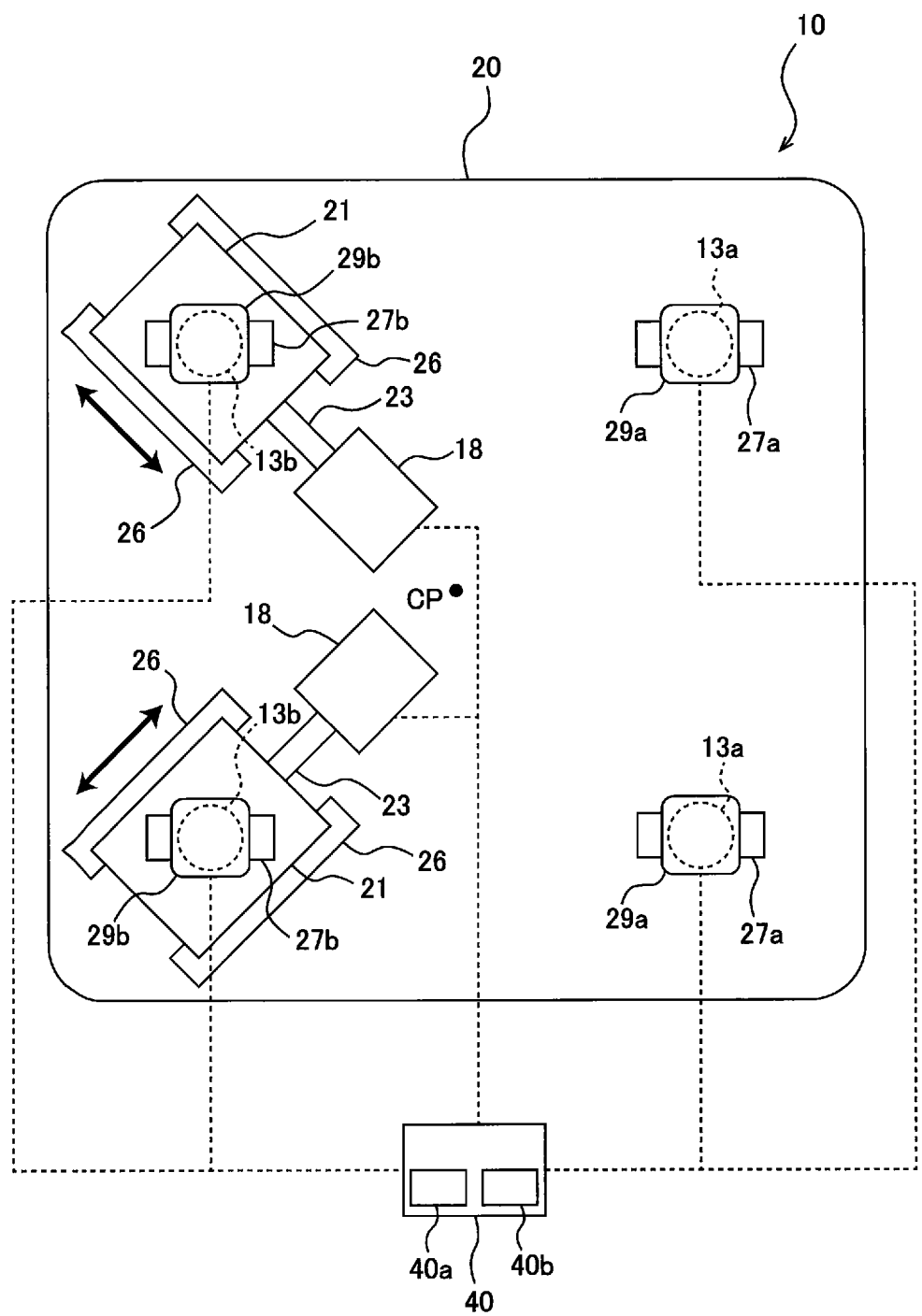
FIG. 3 is a bottom view of the substrate holding apparatus shown in FIG. 1.

Embodiments will now be described with reference to the drawings. FIG. 1 is a plan view schematically showing an embodiment of a substrate holding apparatus, FIG. 2 is a side view of the substrate holding apparatus shown in FIG. 1, and FIG. 3 is a bottom view of the substrate holding apparatus shown in FIG. 1. The substrate holding apparatus of this embodiment is configured to cause a wafer W, which is an example of a substrate, to make a circular motion and rotate the wafer W about its axis while holding the wafer W. A substrate holding apparatus 10 includes a plurality of rollers 11*a* and a plurality of rollers 11*b*, both of which are capable of contacting a periphery of the wafer W, a plurality of electric motors 29*a* and a plurality of electric motors 29*b* for rotating the rollers 11*a*, 11*b*, respectively, a plurality of eccentric shafts 13*a* and a plurality of eccentric shafts 13*b* coupling the rollers 11*a*, 11*b* and the electric motors 29*a*, 29*b* to each other, respectively, and an operation controller 40 for causing the electric motors 29a, 29b to rotate at the same speed with the same phase.

The operation controller 40 includes at least one computer. The operation controller 40 includes a memory 40a and an arithmetic device 40b. The arithmetic device 40b includes a CPU (Central Processing Unit) or a GPU (Graphic Processing Unit) that performs arithmetic operations according to instructions contained in a program stored in the memory 40a. The memory 40a includes a main memory (for example, a random access memory) that can be accessed by the arithmetic device 40b, and an auxiliary memory (for example, a hard disk drive or a solid state drive) that stores data and the program.

Each roller 11a has a wafer holding surface (or a substrate holding surface) 31a for holding the periphery of the wafer W, and each roller 11b has a wafer holding surface (or a substrate holding surface) 31b for holding the periphery of the wafer W. Each roller 11a and each roller 11b have the same structure and the same size. The eccentric shafts 13a, 13b are arranged around a predetermined central axis CP of the substrate holding apparatus 10.

The substrate holding apparatus 10 of this embodiment includes two rollers 11a, two rollers 11b, two eccentric shafts 13a, two eccentric shafts 13b, two electric motors 29a, and two electric motors 29b. It is noted, however, that the numbers of these components are not limited to those of this embodiment.

Each of the eccentric shafts 13a has a first shaft portion 14a, a second shaft portion 15a which is eccentric relative to the first shaft portion 14a, and an intermediate shaft portion 16a that couples the first shaft portion 14a to the second shaft portion 15a. At least two of the first shaft portion 14a, the second shaft portion 15a, and the intermediate shaft portion 16a may be an integrated structure. For example, the first shaft portion 14a and the intermediate shaft portion 16a may be an integrated structure. In another example, all of the first shaft portion 14a, the second shaft portion 15a, and the intermediate shaft portion 16a may be an integrated structure. Each of the eccentric shafts 13a shown in FIG. 2 has a shape of a crankshaft, but the shape of each of the eccentric shafts 13a is not limited to this embodiment as long as the second shaft portion 15a is eccentric by a predetermined distance from the first shaft portion 14a.

The rollers 11a are fixed to ends of the second shaft portions 15a, respectively, and the other ends of the second shaft portions 15a are secured to the intermediate shaft portions 16a, respectively. Ends of the first shaft portions 14a are coupled to the electric motors 29a through couplings 28a, respectively, and the other ends of the first shaft portions 14a are secured to the intermediate shaft portions 16a, respectively.

Each of the eccentric shafts 13b has a first shaft portion 14b, a second shaft portion 15b which is eccentric relative to the first shaft portion 14b, and an intermediate shaft portion 16b that couples the first shaft portion 14b to the second shaft portion 15b. At least two of the first shaft portion 14b, the second shaft portion 15b, and the intermediate shaft portion 16b may be an integrated structure. For example, the first shaft portion 14b and the intermediate shaft portion 16b may be an integrated structure. In another example, all of the first shaft portion 14b, the second shaft portion 15b, and the intermediate shaft portion 16b may be an integrated structure. Each of the eccentric shafts 13b shown in FIG. 2 has a shape of a crankshaft, but the shape of each of the eccentric shafts 13b is not limited to this embodiment as long as the second shaft portion 15b is eccentric by a predetermined distance from the first shaft portion 14b.

The rollers 11b are fixed to ends of the second shaft portions 15b, respectively, and the other ends of the second shaft portions 15b are secured to the intermediate shaft portions 16b, respectively. Ends of the first shaft portions 14b are coupled to the electric motors 29b through couplings 28b, respectively, and the other ends of the first shaft portions 14b are secured to the intermediate shaft portions 16b, respectively.

Each electric motor 29a is configured to rotate the eccentric shaft 13a about the first shaft portion 14a, and each electric motor 29b is configured to rotate the eccentric shaft 13b about the first shaft portion 14b. The electric motors 29a, 29b are coupled to the operation controller 40.

The second shaft portion 15a of each eccentric shaft 13a is eccentric by a distance e from the first shaft portion 14a. Accordingly, when the electric motor 29a is in motion, the roller 11a, while rotating about the second shaft portion 15a, makes a circular motion with a radius e. The axis of the roller 11a coincides with the axis of the second shaft portion 15a. Therefore, the roller 11a, while rotating about its axis, makes a circular motion with the radius e around the axis of the first shaft portion 14a. When the roller 11a makes one rotation about the axis of the first shaft portion 14a, the roller 11a makes one rotation about the axis of the roller 11a.

Similarly, the second shaft portion 15b of each eccentric shaft 13b is eccentric by a distance e from the first shaft portion 14b. Accordingly, when the electric motor 29b is in motion, the roller 11b, while rotating about the second shaft portion 15b, makes a circular motion with a radius e. The axis of the roller 11b coincides with the axis of the second shaft portion 15b. Therefore, the roller 11b, while rotating about its axis, makes a circular motion with the radius e around the axis of the first shaft portion 14b. When the roller 11b makes one rotation about the axis of the first shaft portion 14b, the roller 11b makes one rotation about the axis of the roller 11b. In this specification, the circular motion is defined as a movement of an object in a circular orbit.

Operations of the electric motors 29a, 29b are controlled by the operation controller 40. As described above, the operation controller 40 is configured to cause all the electric motors 29a, 29b to rotate at the same speed with the same phase. More specifically, the operation controller 40 instructs the electric motors 29a, 29b such that all the electric motors 29a, 29b start at the same timing and all the electric motors 29a, 29b rotate in the same direction. Further, the operation controller 40 synchronizes the respective rotational speeds and the respective phases of the electric motors 29a, 29b during the operations of the electric motors 29a, 29b.

As a result, all the eccentric shafts 13a, 13b rotate about the axes of the first shaft portions 14a, 14b in the same direction at the same rotational speed with the same phase. All the rollers 11a, 11b make a circular motion about the axes of the first shaft portions 14a, 14b while rotating about their own axes of the rollers 11a, 11b in the same direction at the same rotational speed with the same phase. Therefore, when the operation controller 40 sets the electric motors 29a, 29b in motion, the wafer W, held by the rollers 11a, 11b, makes a circular motion with the radius e, while rotating about the axis of the wafer W.

Thus, the substrate holding apparatus 10, with its simple configuration, can rotate the wafer W about its axis while causing the wafer W to make a circular motion. The combination of the circular motion of the wafer W and the rotation of the wafer W about its axis can increase the speed of the wafer W at any point on the surface of the wafer W. Therefore, when a processing head, which will be described later, is pressed against the surface of the wafer W, the relative speed between the processing head and the surface of the wafer W can be increased, thereby increasing a processing rate of the wafer W.

A counter weight 17a and a counter weight 17b are secured to each eccentric shaft 13a and each eccentric shaft 13b, respectively. More specifically, the counter weights 17a, 17b are secured to the intermediate shaft portions 16a, 16b, respectively. The counter weight 17a and the roller 11a are arranged symmetrically with respect to the first shaft portion 14a. The weight of the counter weight 17a is such that a centrifugal force, which is generated in the radial direction from the first shaft portion 14a toward the roller 11a when the eccentric shaft 13a is rotating about the first shaft portion 14a, is canceled by a centrifugal force generated in the counter weight 17a.

Similarly, the counter weight 17b and the roller 11b are arranged symmetrically with respect to the first shaft portion 14b. The weight of the counter weight 17b is such that a centrifugal force, generated in the radial direction from the first shaft portion 14b toward the roller 11b when the eccentric shaft 13b is rotating about the first shaft portion 14b, is canceled by a centrifugal force generated in the counter weight 17b. Such counter weights 17a, 17b can prevent vibration of the eccentric shafts 13a, 13b due to weight imbalance during rotation of the eccentric shafts 13a, 13b.

The substrate holding apparatus 10 further includes a base plate 20, a plurality of linear motion guides 26 secured to a lower surface of the base plate 20, a plurality of movable bases 21 supported by the linear motion guides 26, and a plurality of actuators 18 coupled to the movable bases 21. Each linear motion guide 26 is configured to restrict movement of each movable base 21 to a linear movement in a direction parallel to the lower surface of the base plate 20.

Each movable base 21 has a bearing 24 which rotatably supports the eccentric shaft 13b, and further has a coupling member 23 coupled to each actuator 18. The actuators 18 are coupled to the eccentric shafts 13b through the movable bases 21, respectively. The movable bases 21, which include the bearings 24, respectively, are independently moved together with the eccentric shafts 13b by the actuators 18, respectively.

The actuators 18 are secured to the lower surface of the base plate 20. The operations of the actuators 18 are controlled by the operation controller 40. The operation controller 40 can cause the actuators 18 to operate independently of each other. Each actuator 18 is configured to move each movable base 21 in parallel with the base plate 20.

The eccentric shafts 13a extend through the base plate 20. The rollers 11a are arranged above the base plate 20, while the electric motors 29a are arranged below the base plate 20. The eccentric shafts 13a are rotatably supported by bearings 19 held on the base plate 20. The positions of these eccentric shafts 13a are fixed. The electric motors 29a are secured to the base plate 20 through electric motor support members 27a, respectively. More specifically, the electric motor support members 27a are secured to the lower surface of the base plate 20, and the electric motors 29a are secured to the electric motor support members 27a, respectively.

The eccentric shafts 13b extend through the movable bases 21 and the base plate 20. The rollers 11b are arranged above the base plate 20, while the electric motors 29b are arranged below the base plate 20. The eccentric shafts 13b are rotatably supported by the bearings 24 of the movable bases 21, respectively. The electric motors 29b are secured to the movable bases 21 through electric motor support members 27b, respectively. More specifically, the electric motor support members 27b are secured to the lower surface of the movable bases 21, and the electric motors 29b are secured to the electric motor support members 27b, respectively.

According to the above-described construction, the eccentric shafts 13a are reference shafts that cannot move relative to the base plate 20, while the eccentric shafts 13b are movable shafts that can move relative to the base plate 20. In the following descriptions, the eccentric shafts 13a may be referred reference shafts 13a, and the eccentric shafts 13b may be referred movable shafts 13b. The actuators 18 are coupled to the movable shafts 13b through the movable bases 21. Each movable base 21 has the bearing 24 which rotatably supports the movable shaft 13b, and further has the coupling member 23 coupled to the actuator 18. Therefore, the movable base 21 couples the actuator 18 to the movable shaft 13b.

The actuators 18 can move the movable shafts 13b through the movable bases 21 in parallel with the base plate 20. Specifically, the actuators 18 are configured to move the movable shafts 13b in a direction closer to the reference shafts 13a and in a direction away from the reference shafts 13a. When the two movable shafts 13b move in the direction closer to the reference shafts 13a, the wafer W is held by the two rollers 11a and the two rollers 11b. When the two movable shafts 13b move in the direction away from the two reference shafts 13a, the wafer W is released from the two rollers 11a and the two rollers 11b.

As shown in FIG. 3, in this embodiment, the actuators 18 and the linear motion guides 26 are oriented toward the central axis CP of the substrate holding apparatus 10. The actuators 18 move the movable shafts 13b in directions of arrows in FIG. 3. In this embodiment, the direction closer to the reference shafts 13a and the direction away from the reference shafts 13a are a direction toward the central axis CP and a direction away from the central axis CP. When the movable shafts 13b are moved in the direction toward the central axis CP, the rollers 11b can hold the wafer W with clamping forces acting toward the center of the wafer W. According to the construction of this embodiment, the substrate holding apparatus 10 can efficiently hold the wafer W with a minimum force. In one embodiment, each of the actuators 18 and each of the linear motion guides 26 may be oriented toward each of the reference shafts 13a.

Figure 4A:
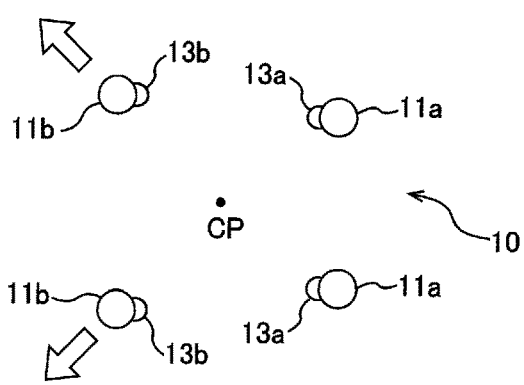
FIGS. 4A, 4B, 4C, 4D are schematic views each illustrating an operation of the substrate holding apparatus when receiving a wafer.

FIGS. 4A through 4D are schematic views illustrating the operation of the substrate holding apparatus 10 when receiving the wafer W. As shown in FIG. 4A, before the substrate holding apparatus 10 receives the wafer W, each actuator 18 (see FIGS. 2 and 3) is operated to move each roller 11b in the direction away from the central axis CP. At this time, the rollers 11a and 11b are eccentric outwardly.

Figure 4B:
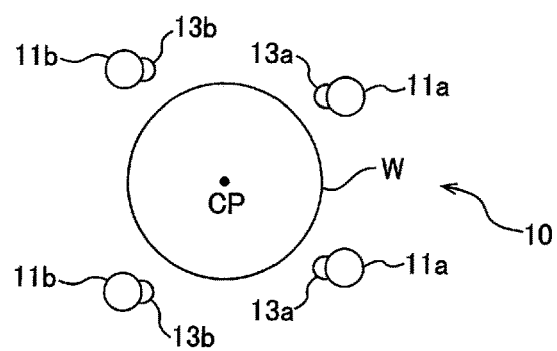
Figure 4C:
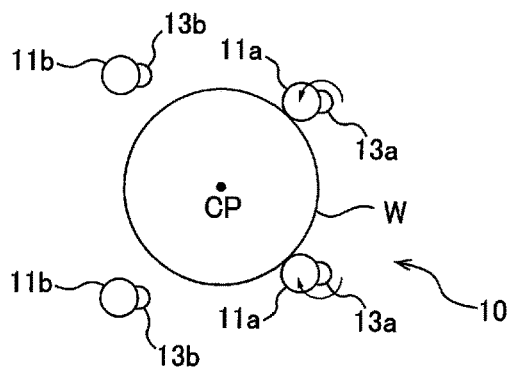
Figure 4D:
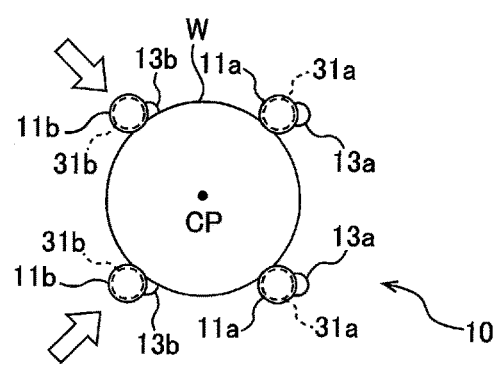

Next, as shown in FIG. 4B, the wafer W is transported to the substrate holding apparatus 10 by a not-shown transport device. Further, as shown in FIG. 4C, while the wafer W is located between the rollers 11a and the rollers 11b, the reference shafts 13a are rotated 180 degrees to move the rollers 11a inwardly. Thereafter, as shown in FIG. 4D, the actuators 18 move the rollers 11b and the movable shafts 13b in the direction closer to the reference shafts 13a until the rollers 11b come into contact with the wafer W.

In this manner, the periphery of the wafer W is held by the wafer holding surfaces 31a of the rollers 11a and the wafer holding surfaces 31b of the rollers 11b. When the wafer W is to be removed from the substrate holding apparatus 10, the steps shown in FIGS. 4A through 4D are performed in the reverse order.

In a conventional substrate holding apparatus (for example, see Japanese Laid-Open Patent Publication No. 2019-83224), a plurality of movable shafts are supported by one support plate. The conventional substrate holding apparatus is configured to hold a substrate by moving the plurality of movable shafts together with the support plate by a single actuator coupled to the support plate. According to such a construction, when vibration occurs in one of the movable shafts due to a certain cause (e.g., a phase shift between the plurality of eccentric shafts), the vibration propagates to other movable shafts. As a result, holding of the substrate becomes unstable.

In contrast, in the embodiment described above, the two movable shafts 13b are supported by the two movable bases 21, respectively, and further coupled to the two actuators 18, respectively. Accordingly, even when vibration occurs in one movable shaft 13b during rotation of the wafer W, the above discussed configurations can prevent the vibration from propagating to the other movable shaft 13b. As a result, the substrate holding apparatus 10 can stably hold the wafer W.

Figure 5:
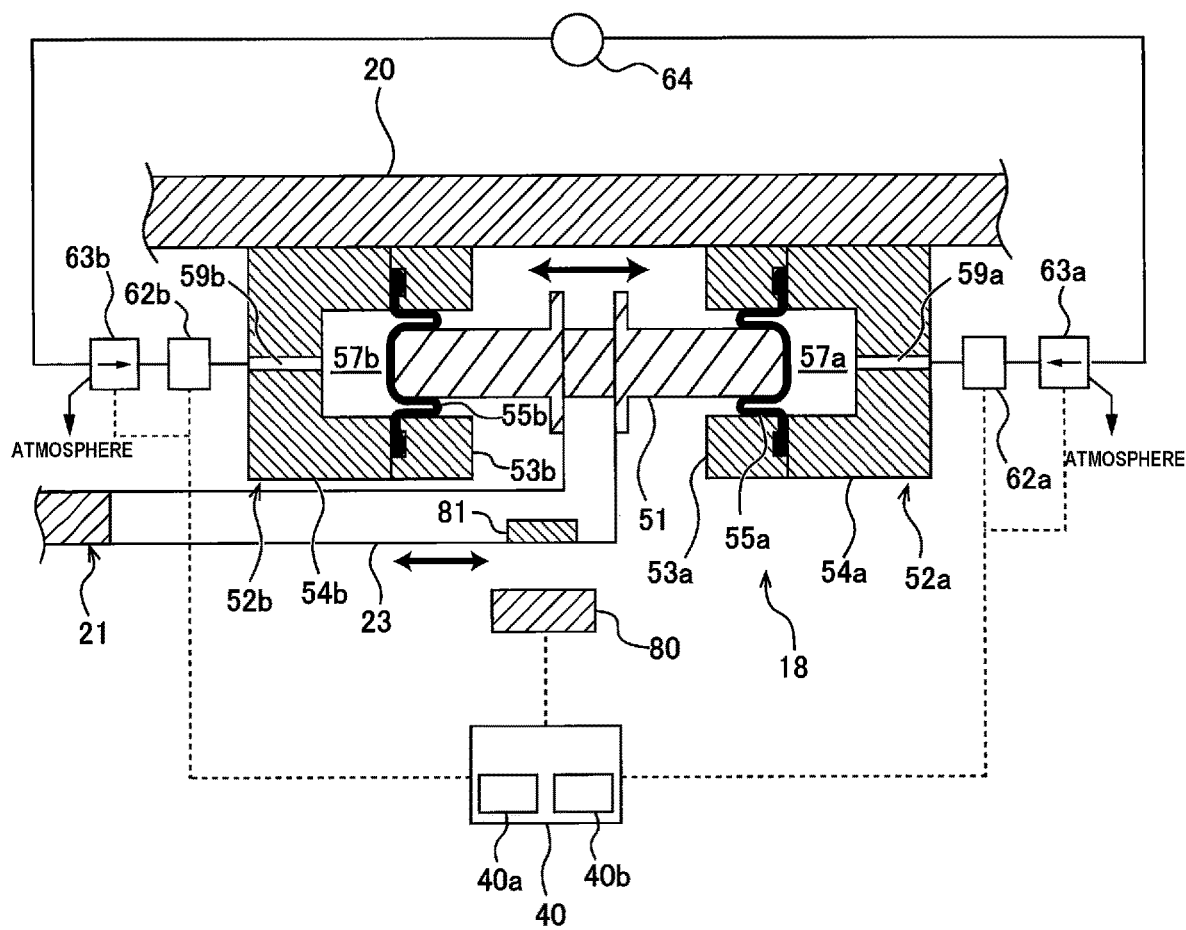
FIG. 5 is a schematic view showing an embodiment of an actuator.

FIG. 5 is a schematic view showing an embodiment of the actuator 18. Each actuator 18 includes a piston 51 arranged in the longitudinal direction of the actuator 18, housings 52a, 52b arranged outwardly of the piston 51, and diaphragms 55a, 55b which form pressure chambers 57a, 57b between the piston 51 and the housings 52a, 52b. The piston 51 is movable in directions indicated by arrows in FIG. 5 (i.e., in the longitudinal direction of the actuator 18). The housings 52a, 52b are arranged away from the piston 51. The housing 52a is arranged so as to surround one end of the piston 51, and the housing 52b is arranged so as to surround the other end of the piston 51.

The coupling member 23 of the movable base 21 is coupled to the piston 51. The piston 51 is supported by the coupling member 23. The movable base 21, including the coupling member 23, is movable together with the piston 51 in directions indicated by arrows in FIG. 5. More specifically, the movable base 21 is configured to be movable together with the piston 51 in the direction closer to the reference shaft 13a and in the direction away from the reference shaft 13a. In this embodiment, since the actuator 18 is oriented toward the central axis CP of the substrate holding apparatus 10 (see FIG. 3), the moving directions of the piston 51 and the movable base 21 are the direction toward the central axis CP and the direction away from the central axis CP.

The housings 52a, 52b include housing bodies 53a, 53b, respectively, which are arranged so as to surround a side surface of the piston 51. The housings 52a, 52b further include lids 54a, 54b, respectively, which are fixed to the housing bodies 53a, 53b. A rim of the diaphragm 55a is sandwiched between the housing body 53a and the lid 54a. Similarly, a rim of the diaphragm 55b is sandwiched between the housing body 53b and the lid 54b.

The pressure chamber 57a is formed by the diaphragm 55a and an inner surface of the housing 52a. Similarly, the pressure chamber 57b is formed by the diaphragm 55b and an inner surface of the housing 52b. More specifically, the pressure chamber 57a is formed by the diaphragm 55a and an inner surface of the lid 54a, and the pressure chamber 57b is formed by the diaphragm 55b and an inner surface of the lid 54b. The diaphragms 55a, 55b have the same structure.

In this embodiment, the housings 52a, 52b have the same structure, but may have different structures.

Compressed-gas flow passages 59a, 59b are formed in the lids 54a, 54b of the housings 52a, 52b, respectively. The compressed-gas flow passages 59a, 59b are coupled to a compressed-gas supply source 64 via pressure regulators 62a, 62b and switching valves 63a, 63b. The pressure chambers 57a, 57b communicate with the pressure regulators 62a, 62b through the compressed-gas flow passages 59a, 59b, respectively.

When the piston 51 is to be moved, the switching valves 63a, 63b are operated to allow the pressure chambers 57a, 57b to communicate with the compressed-gas supply source 64. In this embodiment, the switching valves 63a, 63b are coupled to the operation controller 40. The switching valves 63a, 63b are valves for allowing the pressure chambers 57a, 57b to communicate with the compressed-gas supply source 64 or the atmosphere selectively. Three-way valves may be used as the switching valves 63a, 63b.

A compressed gas, such as compressed air, is supplied from the compressed-gas supply source 64 through the compressed-gas flow passages 59a, 59b to the pressure chambers 57a, 57b. Examples of the compressed-gas supply source 64 may include a pump, and a compressed-gas supply line which has been pre-installed as a utility in a factory. Pressures of the compressed gas in the pressure chambers 57a, 57b are regulated by the pressure regulators 62a, 62b, respectively. In this embodiment, the pressure regulators 62a, 62b are electropneumatic regulators. The pressure regulators 62a, 62b of this embodiment are coupled to the operation controller 40. In one embodiment, the pressure regulators 62a, 62b may be manually operated pressure regulators. In this case, the pressure regulators 62a, 62b are not coupled to the operation controller 40.

The operation controller 40 transmits predetermined set pressure values to the pressure regulators 62a, 62b. The pressure regulators 62a, 62b are configured to regulate the pressures of the compressed gas in the pressure chambers 57a, 57b according to the set pressure values. Examples of such pressure regulators 62a, 62b may include electropneumatic regulators and mechanical regulators. In one embodiment, the pressure regulator 62b may be an electropneumatic regulator, and the pressure regulator 62a may be a mechanical regulator. In the case where the pressure regulator 62a is the mechanical regulator, the pressure regulator 62a is not coupled to the operation controller 40.

The piston 51 moves in response to a difference between the pressure in the pressure chamber 57a and the pressure in the pressure chamber 57b. When the pressure in the pressure chamber 57a is higher than the pressure in the pressure chamber 57b, the piston 51 is moved in the direction away from the reference shaft 13a (see FIG. 3). When the pressure in the pressure chamber 57b is higher than the pressure in the pressure chamber 57a, the piston 51 is moved in the direction closer to the reference shaft 13a (see FIG. 3).

In this embodiment, when the piston 51 is to be moved, the compressed gas is introduced into both the pressure chambers 57a, 57b such that the pressure of the compressed gas in one of the pressure chambers 57a, 57b is higher than the pressure of the compressed gas in the other. In one embodiment, when the piston 51 is to be moved, the compressed gas may be introduced into only one of the pressure chamber 57a and the pressure chamber 57b, and the other may communicate with the atmosphere.

Figure 6:
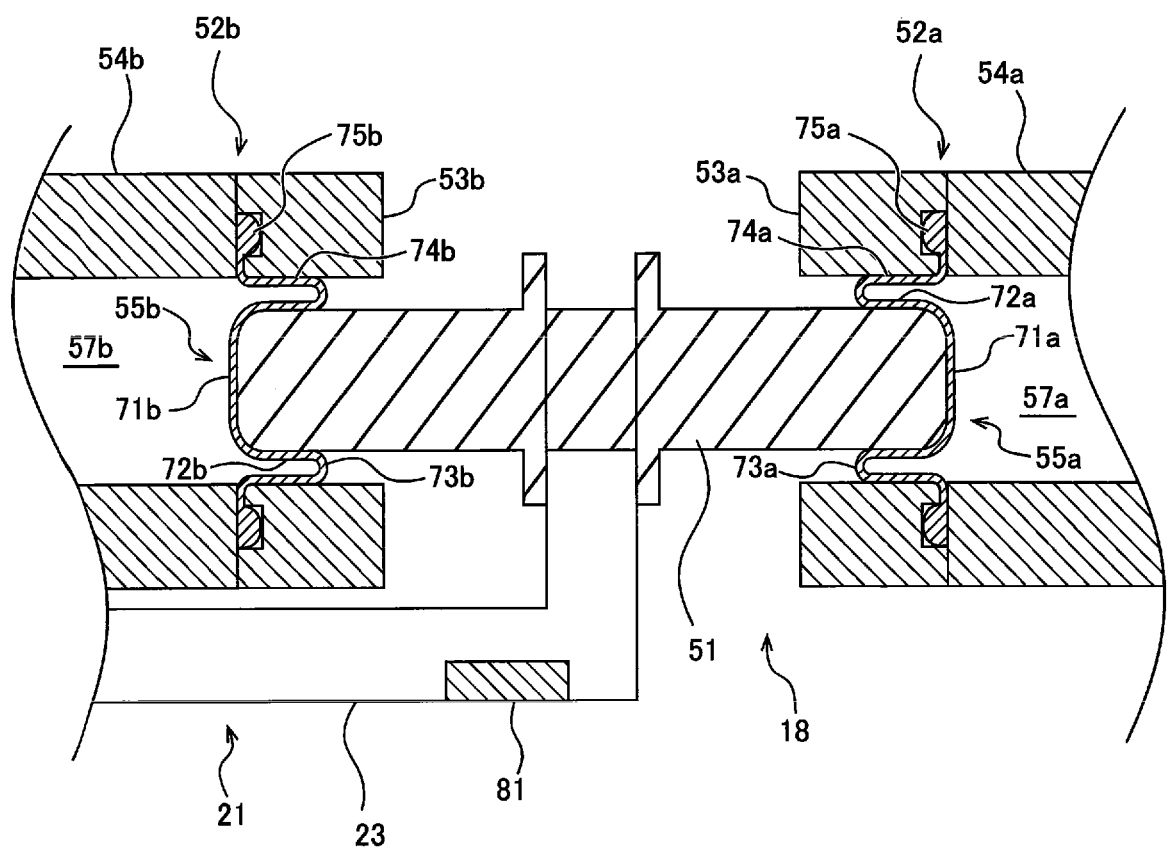
FIG. 6 is a cross-sectional view schematically showing an embodiment of diaphragms.

FIG. 6 is a cross-sectional view schematically showing an embodiment of the diaphragms 55a, 55b. The diaphragm 55a has a central portion 71a in contact with one end of the piston 51, an inner wall portion 72a connected to the central portion 71a and extending along the side surface of the piston 51, a folded-back portion 73a connected to the inner wall portion 72a and having a curved cross section, and an outer wall portion 74a connected to the folded-back portion 73a and located outside the inner wall portion 72a. The diaphragm 55a is in contact with one end of the piston 51. When the compressed gas is introduced into the pressure chamber 57a, the outer wall portion 74a contacts the inner surface of the housing body 53a.

In this embodiment, the central portion 71a has a circular shape. The inner wall portion 72a and the outer wall portion 74a each have a cylindrical shape, and the inner wall portion 72a is in contact with the side surface of the piston 51. The outer wall portion 74a is arranged so as to surround the inner wall portion 72a.

Similarly, the diaphragm 55b has a central portion 71b in contact with the other end of the piston 51, an inner wall portion 72b connected to the central portion 71b and extending along the side surface of the piston 51, a folded-back portion 73b connected to the inner wall portion 72b and having a curved cross section, and an outer wall portion 74b connected to the folded-back portion 73b and located outside the inner wall portion 72b. The diaphragm 55b is in contact with the other end of the piston 51. When the compressed gas is introduced into the pressure chamber 57b, the outer wall portion 74b contacts the inner surface of the housing body 53b.

In this embodiment, the central portion 71b has a circular shape. The inner wall portion 72b and the outer wall portion 74b each have a cylindrical shape, and the inner wall portion 72b is in contact with the side surface of the piston 51. The outer wall portion 74b is arranged so as to surround the inner wall portion 72b.

The diaphragms 55a, 55b are in contact with the piston 51, but are not fixed to the piston 51. A thick portion 75a, constituting the rim of the diaphragm 55a, is sandwiched between the housing body 53a and the lid 54a. Similarly, a thick portion 75b, constituting the rim of the diaphragm 55b, is sandwiched between the housing body 53b and the lid 54b. The diaphragms 55a, 55b are made of flexible materials. Examples of the materials of the diaphragms 55a, 55b may include chloroprene rubber, fluororubber, and silicone rubber. Chloroprene rubber having a high resistance to flex fatigue is preferably used.

Figure 7A:
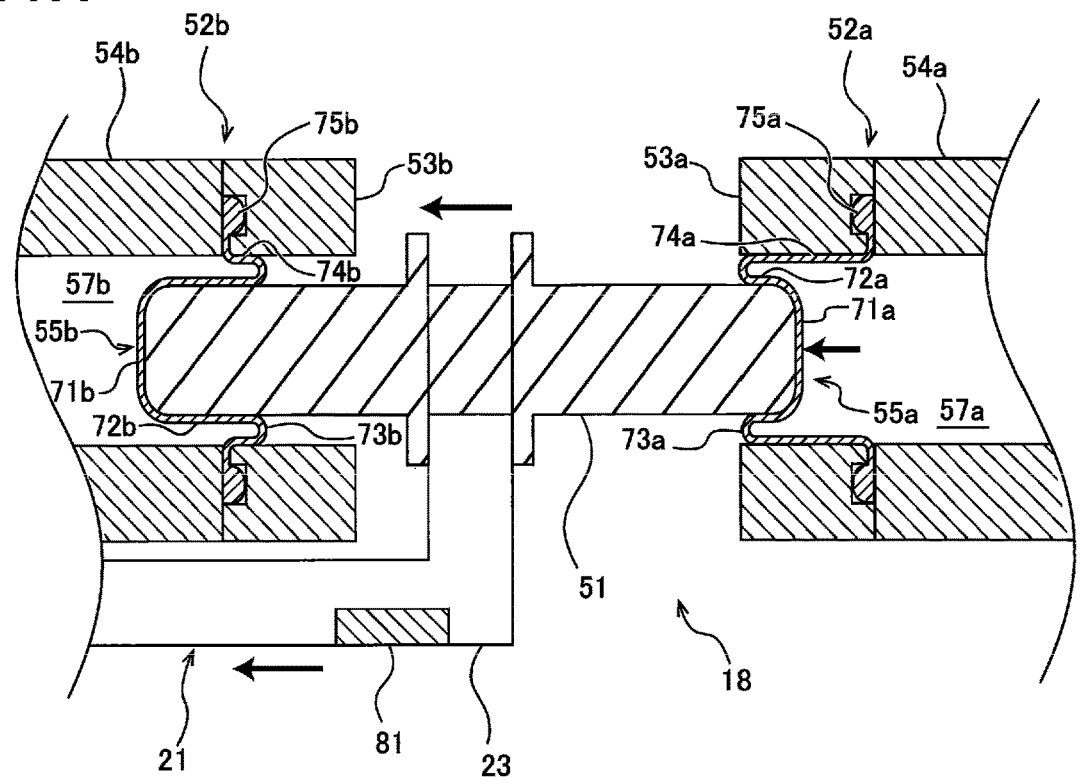
FIG. 7A is a view showing a state of the actuator when pressure in a first pressure chamber is higher than pressure in a second pressure chamber.
Figure 7B:
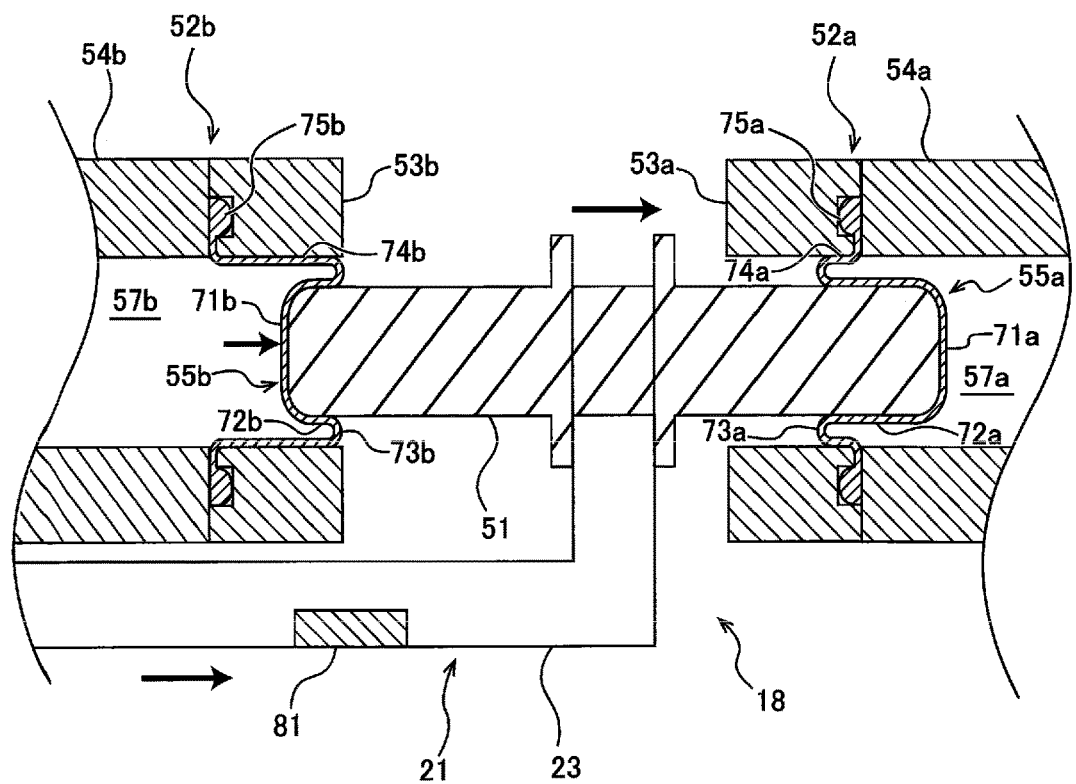
FIG. 7B is a view showing a state of the actuator when the pressure in the second pressure chamber is higher than the pressure in the first pressure chamber.

FIG. 7A is a view showing a state of the actuator 18 when the pressure in the pressure chamber 57a (first pressure chamber 57a) is higher than the pressure in the pressure chamber 57b (second pressure chamber 57b). FIG. 7B is a view showing a state of the actuator 18 when the pressure in the pressure chamber 57b is higher than the pressure in the pressure chamber 57a.

As shown in FIG. 7A, when the pressure in the pressure chamber 57a is higher than the pressure in the pressure chamber 57b, a force in a direction toward the pressure chamber 57b is applied to the piston 51. As a result, the piston 51, the movable base 21, and the movable shaft 13b move together in the direction away from the reference shaft 13a (see FIG. 3) while the diaphragms 55a, 55b are deformed. At this time, while the folded-back portion 73a retains its shape, a part of the inner wall portion 72a becomes a part of the folded-back portion 73a, and a part of the folded-back portion 73a becomes a part of the outer wall portion 74a. At the same time, while the folded-back portion 73b retains its shape, a part of the outer wall portion 74b becomes a part of the folded-back portion 73b, and a part of the folded-back portion 73b becomes a part of the inner wall portion 72b.

As shown in FIG. 7B, when the pressure in the pressure chamber 57b is higher than the pressure in the pressure chamber 57a, a force in a direction toward the pressure chamber 57a is applied to the piston 51. As a result, the piston 51, the movable base 21, and the movable shaft 13b move together in the direction closer to the reference shaft 13a (see FIG. 3) while the diaphragm 55b is deformed. At this time, while the folded-back portion 73b retains its shape, a part of the inner wall portion 72b becomes a part of the folded-back portion 73b, and a part of the folded-back portion 73b becomes a part of the outer wall portion 74b. At the same time, while the folded-back portion 73a retains its shape, a part of the outer wall portion 74a becomes a part of the folded-back portion 73a, and a part of the folded-back portion 73a becomes a part of the inner wall portion 72a.

Such motions of the diaphragms 55a, 55b enable the piston 51 to move smoothly while the piston 51 hardly receives a reaction force from the diaphragms 55a, 55b. If a piston and a housing are in contact with each other as in a typical air cylinder, a sliding resistance is generated between the piston and the housing when vibration occurs during rotation of a wafer. Such sliding resistance exerts an excessive load on a rotating wafer, thus causing unstable holding of the wafer. In this embodiment, since the housings 52a, 52b are arranged away from the piston 51, no sliding resistance is generated between the piston 51 and the housings 52a, 52b. As a result, the substrate holding apparatus 10 can stably hold the wafer W without exerting an excessive load on the wafer W.

As shown in FIG. 5, the substrate holding apparatus 10 includes a non-contact type distance sensor 80 for measuring a movement distance of the movable shaft 13b. The distance sensor 80 is arranged outside the actuator 18, and is located near the actuator 18 and the movable base 21. A magnet 81 is fixed to the coupling member 23 of the movable base 21, and the distance sensor 80 faces the magnet 81. In this embodiment, the distance sensor 80 is a magnetic sensor, and can measure a distance of the movement of the magnet 81 relative to the distance sensor 80.

The position of the distance sensor 80 is fixed. On the other hand, the movable base 21, the piston 51, and the movable shaft 13b can move together. Therefore, when the movable shaft 13b moves in the direction closer to the reference shaft 13a and in the direction away from the reference shaft 13a, a relative position of the magnet 81 fixed to the movable base 21 with respect to the distance sensor 80 changes. A movement distance of the magnet 81 corresponds to the movement distance of the movable shaft 13b. Therefore, the distance sensor 80 can measure the movement distance of the movable shaft 13b. The movement distance of the movable shaft 13b is a position of the movable shaft 13b relative to a predetermined reference position. In the following descriptions, the position of the movable shaft 13b relative to the predetermined reference position may be simply referred to a position of the movable shaft 13b.

The distance sensor 80 is coupled to the operation controller 40. The distance sensor 80 transmits a measured value of the movement distance of the movable shaft 13b (a measured value of the position of the movable shaft 13b) to the operation controller 40. The operation controller 40 can determine whether or not the substrate holding apparatus 10 is holding the wafer W properly (or whether or not an abnormality has occurred in the substrate holding apparatus 10) by comparing the measured value of the movement distance of the movable shaft 13b (the position of the movable shaft 13b) with a preset threshold value. In one embodiment, the operation controller 40 may issue an alarm signal when the measured value of the movement distance (the position of the movable shaft 13b) is larger than the threshold value, or smaller than the threshold value. Further, in one embodiment, The operation controller 40 may determine whether or not the substrate holding apparatus 10 is holding the wafer W properly (or whether or not an abnormality has occurred in the substrate holding apparatus 10) by comparing an index value calculated from a plurality of measured values of the movement distance (a plurality of measured values of the position of the movable shaft 13b) with a preset threshold value. Further, in one embodiment, the operation controller 40 may issue an alarm signal when the index value is larger than the threshold value, or smaller than the threshold value. Examples of the index value may include an average value of positions of the movable shaft 13b during one or more rotations of the roller 11b, and a difference between a maximum value and a minimum value of positions of the movable shaft 13b (i.e., an amplitude of the position of the movable shaft 13b) during one or more rotations of the rollers 11b.

The cause of the fact that the measured value of the movement distance of the movable shaft 13b when moved closer to the reference shaft 13a is smaller than the threshold value may be that the wafer W is not held properly by the substrate holding apparatus 10. The cause of the fact that the measured value of the movement distance is larger than the threshold value may be that the wafer W is broken, or the wafer W is detached (e.g., the wafer W is fell off, or the substrate holding apparatus 10 has failed to hold the wafer W).

Further, in one embodiment, a first threshold value and a second threshold value smaller than the first threshold value may be set for the measured value of the movement distance of the movable shaft 13b. Specifically, the operation controller 40 is configured to issue an alarm signal when the measured value of the movement distance is larger than the first threshold value, and issue an alarm signal when the measured value of the movement distance is smaller than the second threshold value. A range from the second threshold value to the first threshold value is a range of the movement distance of the movable shaft 13b necessary for the rollers 11a, 11b to properly hold the wafer W.

When vibration occurs in the movable shaft 13b during rotation of the wafer W, the position of the movable shaft 13b (or the measured value of the movement distance of the movable shaft 13b) fluctuates according to the vibration. Therefore, the operation controller 40 can detect the vibration of the movable shaft 13b based on the fluctuation of the position of the movable shaft 13b (or the fluctuation of the measured value of the movement distance of the movable shaft 13b) during the rotation of the wafer W. The operation controller 40 can detect abnormal rotation of the wafer W based on the vibration of the movable shaft 13b when the substrate holding apparatus 10 holds and rotates the wafer W. Possible causes of the abnormal rotation of the wafer W include wear, deformation, breakage, and dimensional defect of the wafer holding surfaces 31a, 31b of the rollers 11a, 11b, and phase shift of the rotations of the rollers 11a, 11b.

In one embodiment, the operation controller 40 may compare an amplitude of the measured value of the movement distance of the movable shaft 13b (or an amplitude of the position of the movable shaft 13b) with a preset threshold value, and determine that vibration has occurred in the movable shaft 13b when the amplitude is larger than the threshold value. The operation controller 40 may issue an alarm signal when the amplitude is larger than the threshold value.

Figure 8:
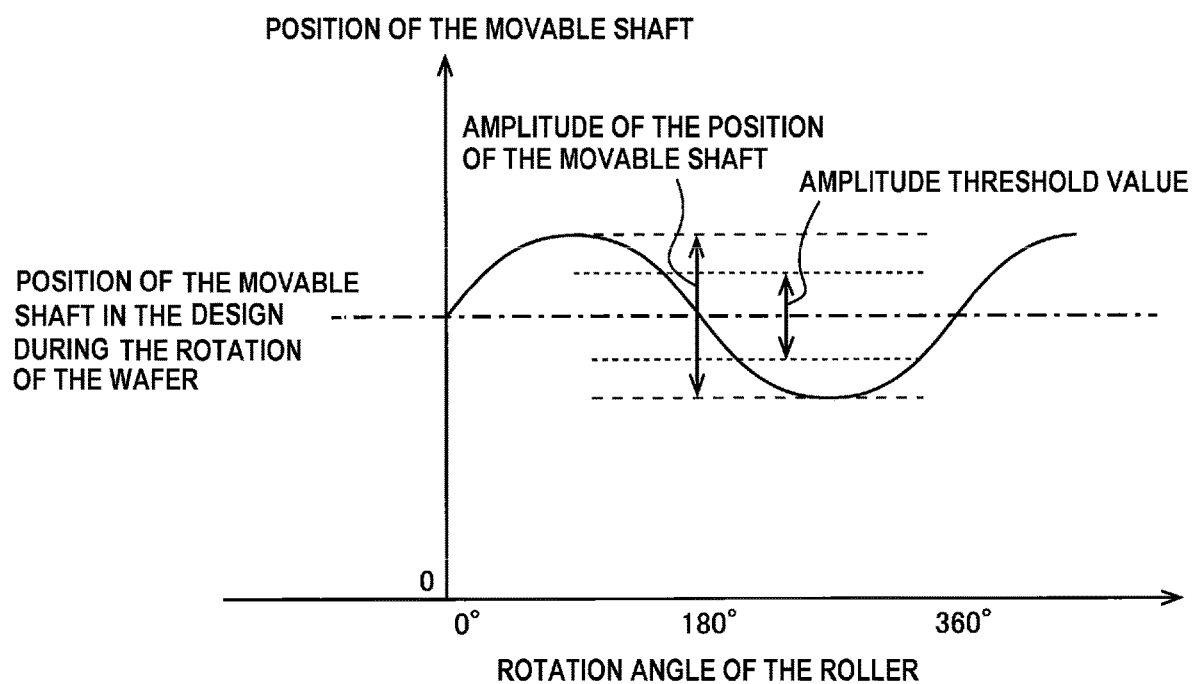
FIG. 8 is a view showing an example of a position of a movable shaft when abnormal rotation of a wafer occurs.

FIG. 8 is a view showing an example of the position of the movable shaft 13b when the abnormal rotation of the wafer W occurs. Horizontal axis in FIG. 8 indicates rotation angle of the roller 11b, and vertical axis in FIG. 8 indicates the position of the movable shaft 13b. In FIG. 8, a value indicating the position of the movable shaft 13b decreases as the movable shaft 13b moves closer to the reference shaft 13a, and increases as the movable shaft 13b moves away from the reference shaft 13a. A position 0 of the movable shaft 13b is defined as a position where the movable shaft 13b is closest to the reference shaft 13a within the movable range of the actuator 18. A rotation angle of 0 degrees of the roller 11b is defined as a predetermined reference angle of the roller 11b. In the example shown in FIG. 8, when the abnormal rotation of the wafer W occurs, the movable shaft 13b vibrates greatly, and the position of the movable shaft 13b fluctuates greatly. At this time, the amplitude of the position of the movable shaft 13b becomes larger than a predetermined amplitude threshold value. Possible causes of the fluctuation of the position of the movable shaft 13b shown in FIG. 8 include wear, deformation, breakage, and dimensional defect of the wafer holding surfaces 31a, 31b of the rollers 11a, 11b, and phase shift of the rotations of the rollers 11a, 11b.

The operation controller 40 compares the amplitude of the position of the movable shaft 13b (the amplitude of the measured value of the movement distance of the movable shaft 13b) with the predetermined amplitude threshold value, and determines that the abnormal rotation of the wafer W has occurred when the amplitude of the position of the movable shaft 13b is larger than the amplitude threshold value. In this specification, the amplitude of the position of the movable shaft 13b is defined as a width of the vibration of the movable shaft 13b. In the example shown in FIG. 8, the amplitude of the position of the movable shaft 13b is a difference between a maximum value and a minimum value of the positions of the movable shaft 13b during one or more rotations of the roller 11b. In one embodiment, the operation controller 40 may compare the amplitude of the position of the movable shaft 13b (or the amplitude of the measured value of the movement distance of the movable shaft 13b) within a time period from when a first rotation time has elapsed since the rotation of the roller 11b has started to when a second rotation time is reached, with a predetermined amplitude threshold value.

Further, in one embodiment, the operation controller 40 may issue an alarm signal when the amplitude of the position of the movable shaft 13b is larger than the amplitude threshold value. Further, in one embodiment, the operation controller 40 may instruct the electric motors 29a, 29b to stop the operations of the electric motors 29a, 29b when the amplitude of the position of the movable shaft 13b is larger than the amplitude threshold value.

Figure 9:
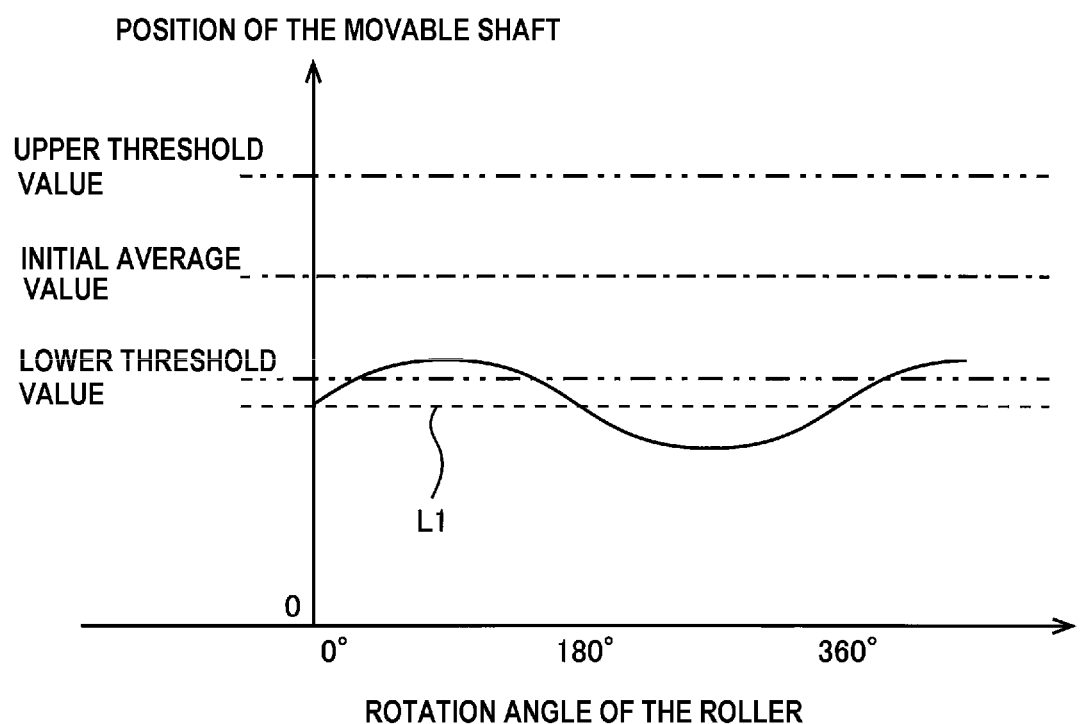
FIG. 9 is a view showing another example of a position of a movable shaft when abnormal rotation of a wafer occurs.

FIG. 9 is a view showing another example of the position of the movable shaft 13b when the abnormal rotation of the wafer W occurs. Details of this embodiment, not particularly described here, are the same as those of the embodiment described with reference to FIG. 8, and therefore duplicate descriptions thereof will be omitted. In the example shown in FIG. 9, an average value of the positions of the movable shaft 13b during one or more rotations of the roller 11b is smaller than an initial average value and a predetermined lower threshold value. In this embodiment, the initial average value is an average value of the positions (measured values) of the movable shaft 13b when the rollers 11a, 11b are not yet used (when they are not worn). Possible causes of the fluctuation of the position of the movable shaft 13b shown in FIG. 9 include wear, deformation, breakage, and dimensional defect of the wafer holding surfaces 31a, 31b of the rollers 11a, 11b. A dotted line L1 in FIG. 9 indicates an average value of the positions of the movable shaft 13b during rotation of the wafer W when the wafer holding surfaces 31a, 31b are worn.

The operation controller 40 compares the average value of the positions of the movable shaft 13b (an average value of the measured values of the movement distance of the movable shaft 13b) during one or more rotations of the roller 11b with the predetermined lower threshold value, and determines that the abnormal rotation of the wafer W has occurred when the average value of the positions of the movable shaft 13b is smaller than the lower threshold value. In one embodiment, the operation controller 40 may compare the average value of the positions of the movable shaft 13b (an average value of the measured values of the movement distance of the movable shaft 13b) during one or more rotations of the roller 11b with a predetermined upper threshold value, and determine that the abnormal rotation of the wafer W has occurred when the average value of the positions of the movable shaft 13b is larger than the upper threshold value. A cause of the fact that the average value of the positions of the movable shaft 13b is larger than the upper threshold value may be that the wafer W is not held properly by the substrate holding apparatus 10. Depending on the setting of the reference position of the movable shaft 13b described above, the average value of the positions of the movable shaft 13b may be larger than the upper threshold value due to wear, deformation, breakage, or dimensional defect of the wafer holding surfaces 31a, 31b of the rollers 11a, 11b.

In one embodiment, the operation controller 40 may issue an alarm signal when the average value of the positions of the movable shaft 13b during one or more rotations of the roller 11b is smaller than the lower threshold value (or when the average value of the positions of the movable shaft 13b during one or more rotations of the roller 11b is larger than the upper threshold value). Further, in one embodiment, the operation controller 40 may instruct the electric motors 29a, 29b to stop the operations of the electric motors 29a, 29b when the average value of the positions of the movable shaft 13b during one or more rotations of the roller 11b is smaller than the lower threshold value (or when the average value of the positions of the movable shaft 13b during one or more rotations of the roller 11b is larger than the upper threshold value). An example of the alarm signal may include a signal that urges an operator to replace the rollers 11a, 11b.

According to the embodiment described with reference to FIG. 9, the operation controller 40 can detect an abnormality or a defect of the rollers 11a, 11b regardless of whether the wafer holding surfaces 31a, 31b of the rollers 11a, 11b are evenly worn or unevenly worn. The embodiment described with reference to FIG. 8 and the embodiment described with reference to FIG. 9 may be combined. For example, when the amplitude of the position of the movable shaft 13b is larger than the amplitude threshold value, or when the average value of the positions of the movable shaft 13b during one or more rotations of the roller 11b is smaller than the lower threshold value, the operation controller 40 may determine that an abnormality has occurred and may issue an alarm signal.

Even when the movable shaft 13b is vibrating, the non-contact type distance sensor 80 can accurately measure the movement distance of the movable shaft 13b without being affected by the vibration. In this embodiment, a plurality of non-contact type distance sensors 80 for measuring movement distances of the movable shafts 13b, respectively, are provided. In one embodiment, a single non-contact distance sensor 80 for measuring the movement distance of one of the plurality of movable shafts 13b may be provided.

Figure 10:
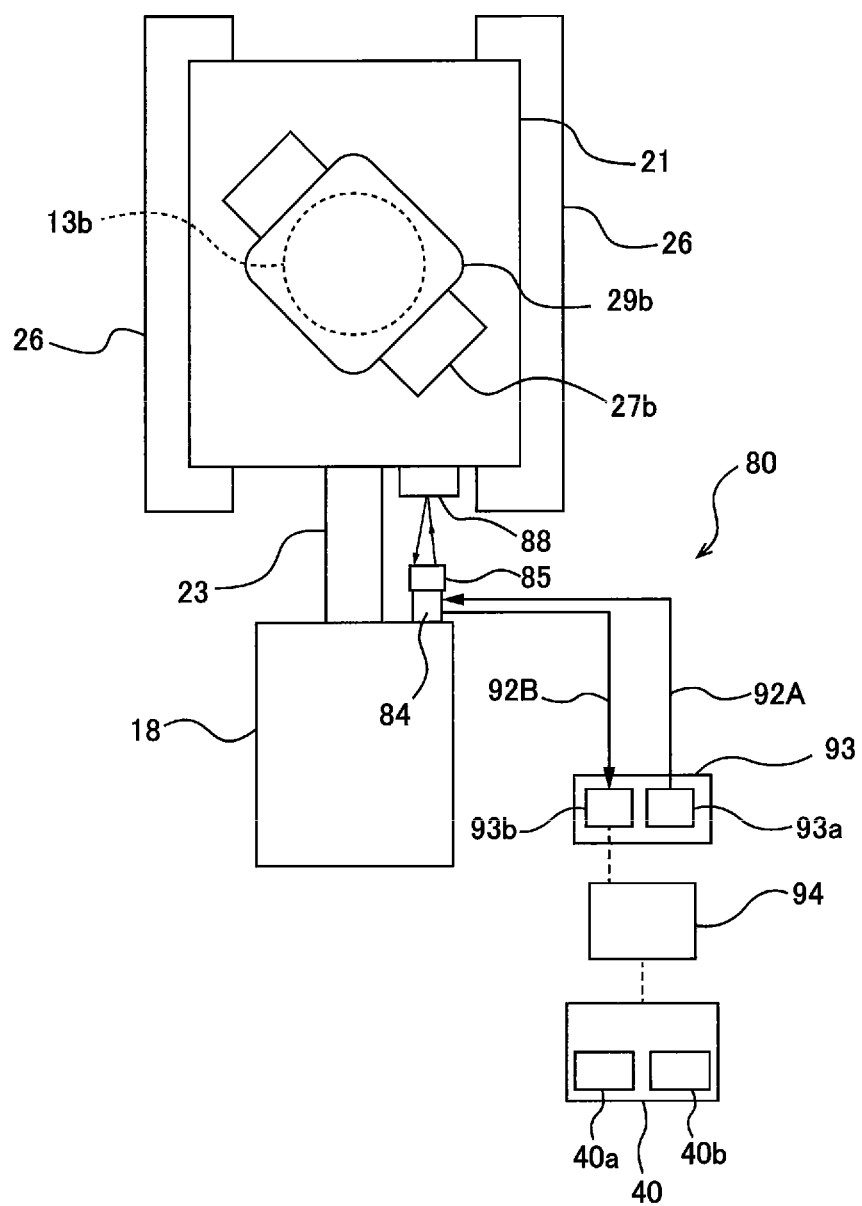
FIG. 10 is a schematic view showing another embodiment of a distance sensor.

In one embodiment, as shown in FIG. 10, the distance sensor 80 may be a non-contact optical sensor. Details of this embodiment, not particularly described here, are the same as those of the embodiments described with reference to FIGS. 5, 8, and 9, and therefore duplicate descriptions thereof will be omitted. The distance sensor 80 of this embodiment includes a sensor head 84 having a light-emitting element and a light-receiving element (both not shown) provided at a front end of the sensor head 84, a converging lens 85 for converging light emitted from the sensor head 84, an amplifier 93 coupled to the sensor head 84 by a light-emitting optical fiber cable 92A and a light-receiving optical fiber cable 92B, and a distance calculator 94 electrically connected to the amplifier 93. The converging lens 85 is mounted to the front end of the sensor head 84.

The sensor head 84 is fixed to the outside of the actuator 18, and the front end of the sensor head 84 is oriented toward the movable base 21. More specifically, in this embodiment, a sensor target 88 is mounted to the movable base 21, and the front end of the sensor head 84 is oriented toward the sensor target 88. The sensor target 88 has a property of reflecting light. An example of the sensor target 88 may include a member composed of ceramic or metal. The amplifier 93 and the distance calculator 94 are located away from the actuator 18.

The amplifier 93 has a light source 93a for emitting light and a light-intensity measuring device 93b for measuring intensity of reflected light. The light emitted from the light source 93a of the amplifier 93 is transmitted through the light-emitting optical fiber cable 92A to the sensor head 84. The sensor head 84 directs the light to the sensor target 88 through the converging lens 85, and receives the reflected light from the sensor target 88. The reflected light is transmitted through the light-receiving optical fiber cable 92B to the amplifier 93. The light-intensity measuring device 93b of the amplifier 93 measures the intensity of the reflected light. The amplifier 93 sends a measured value of the intensity of the reflected light to the distance calculator 94, and the distance calculator 94 converts the measured value of the intensity of the reflected light into a distance. The distance obtained by the distance calculator 94 is the movement distance of the movable shaft 13b. With such a construction, the distance sensor 80 of this embodiment can measure the movement distance of the movable shaft 13b. The distance calculator 94 is coupled to the operation controller 40, and the distance calculator 94 transmits the measured value of the movement distance of the movable shaft 13b to the operation controller 40. In one embodiment, the distance sensor 80 may not include the converging lens 85. The sensor head 84 may direct the light to the sensor target 88 without passing through the converging lens 85, and may receive the reflected light from the sensor target 88 without passing through the converging lens 85.

As described above, only the sensor head 84, which is one of components constituting the distance sensor 80, is mounted to the actuator 18. The sensor head 84 has a function to only emit light and receive reflected light, and therefore the sensor head 84 per se is very compact.

In one embodiment, the sensor head 84 and the converging lens 85 may be arranged in the pressure chamber 57a (or in the pressure chamber 57b). In this arrangement, the front end of the sensor head 84 is oriented toward the central portion 71a (or the central portion 71b) of the diaphragm 55a (or the diaphragm 55b), and the sensor head 84 directs the light to the central portion 71a (or the central portion 71b), and receives reflected light from the diaphragm 55a (or the diaphragm 55b). A sensor target having a property of reflecting light may be fixed to the central portion 71a (or the center portion 71b). Further, in one embodiment, the distance sensor 80 may be a laser displacement meter.

In the embodiments described with reference to FIGS. 1 through 10, the substrate holding apparatus 10 includes the two reference shafts 13a, the two movable shafts 13b, the two actuators 18, the two movable bases 21, and the two linear motion guides 26 arranged around the central axis CP, while the number and interval of arrangements of these components are not limited to this embodiment. In one embodiment, the substrate holding apparatus 10 may include one movable shaft 13b and two or more reference shafts 13a arranged around the central axis CP at appropriate intervals. In this arrangement, the substrate holding apparatus 10 includes one actuator 18, one movable base 21, and one linear motion guide 26.

Further, in one embodiment, the substrate holding apparatus 10 may include three or more movable shafts 13b and three or more reference shafts 13a arranged around the central axis CP at appropriate intervals. In this arrangement, the substrate holding apparatus 10 includes three or more actuators 18, three or more movable bases 21, and three or more linear motion guides 26. Further, in one embodiment, the operation controller 40 may be comprised of a plurality of operation controllers each including a memory and an arithmetic device. In one example, one of the plurality of operation controllers may be coupled to the electric motors 29a, 29b, and the other may be coupled to the distance sensor 80.

Figure 11:
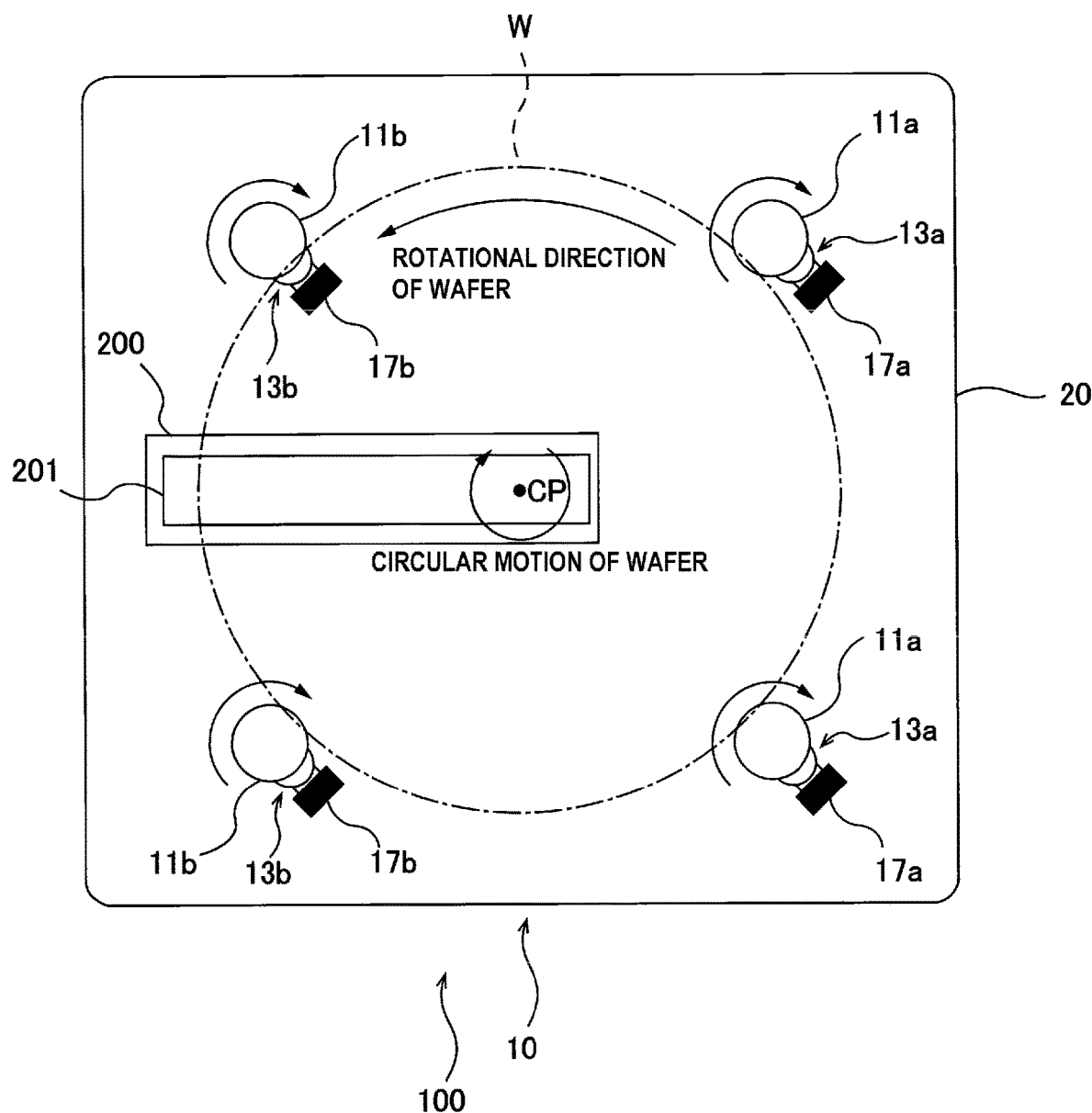
FIG. 11 is a plan view schematically showing an embodiment of a substrate processing apparatus including the substrate holding apparatus described with reference to FIGS. 1 through 10.
Figure 12:
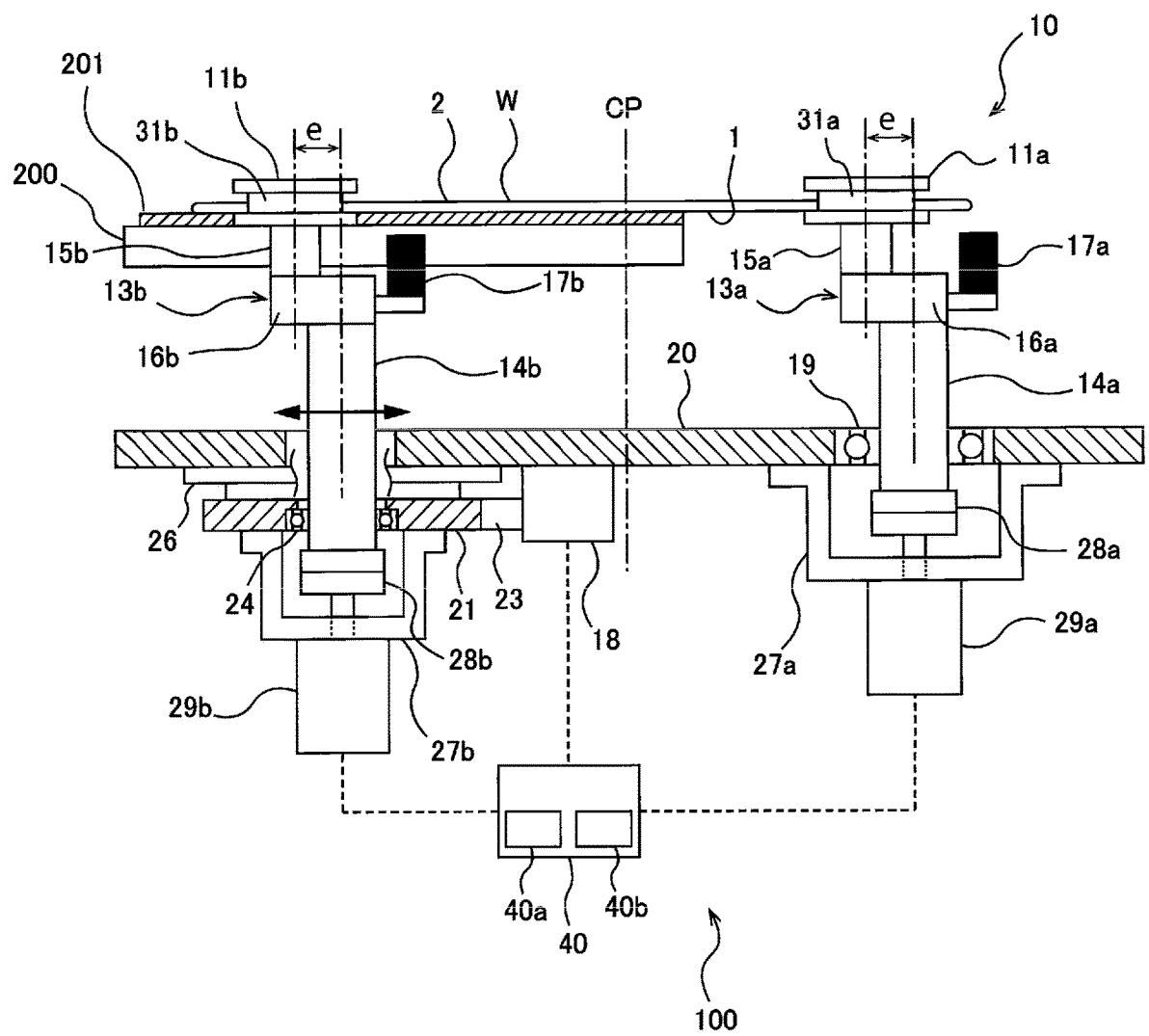
FIG. 12 is a side view of the substrate processing apparatus shown in FIG. 11.

FIG. 11 is a plan view schematically showing an embodiment of a substrate processing apparatus including the substrate holding apparatus 10 described above with reference to FIGS. 1 through 10. FIG. 12 is a side view of the substrate processing apparatus shown in FIG. 11. A substrate processing apparatus 100 of this embodiment includes the substrate holding apparatus 10, and a processing head 200 for bringing a processing tool 201 into contact with a first surface 1 of the wafer W, held by the substrate holding apparatus 10, to process the first surface 1. The processing head 200 is located below the wafer W held by the substrate holding apparatus 10, and the position of the processing head 200 is fixed.

In this embodiment, the first surface 1 of the wafer W is a back surface of the wafer W, i.e. a non-device surface where no device is formed or no device is to be formed. A second surface 2 of the wafer W, which is opposite from the first surface 1, is a front surface, i.e. a device surface where a device(s) is formed or a device(s) is to be formed. In this embodiment, the wafer W, with its first surface 1 facing downward, is horizontally held by the substrate holding apparatus 10.

Detailed operation of the substrate processing apparatus 100 of this embodiment is as follows. The substrate holding apparatus 10 brings the plurality of rollers 11a and the plurality of rollers 11b into contact with the periphery of the wafer W, and rotates the rollers 11a, 11b about their respective own axes and, in addition, causes the rollers 11a, 11b to make a circular motion, thereby rotating the wafer W about its axis and causing the wafer W to make a circular motion. While the wafer W is making the rotation and the circular motion, the processing head 200 places the processing tool 201 in contact with the first surface 1 of the wafer W to process the first surface 1.

In this embodiment, the processing tool 201 is longer than the radius of the wafer W. One end of the processing tool 201 protrudes outwardly from the periphery of the wafer W, while the other end of the processing tool 201 extends across the central axis CP of the substrate holding apparatus 10. Accordingly, the processing head 200 can bring the processing tool 201 into contact with the entirety of the first surface 1 of the rotating wafer W. This configuration enables the processing tool 201 to process the entirety of the first surface 1, including the outermost area, of the wafer W. The processing head 200 is located in such a position as not to contact the rollers 11a, 11b and the eccentric shafts 13a, 13b when the wafer W is making a circular motion.

According to this embodiment, the substrate holding apparatus 10, with its simple structure, can rotate the wafer W about its axis while allowing the wafer W to make a circular motion. The combination of the circular motion of the wafer W and the rotation of the wafer W about its axis can increase the speed of the wafer W at any point on the surface of the wafer W. Therefore, the relative speed between the processing tool 201 and the surface of the wafer W can be increased, thereby increasing a processing rate of the wafer W.

In one embodiment, the processing tool 201 may be a polishing tool for polishing the wafer W. Examples of the polishing tool include a polishing tape and a grindstone. In another embodiment, the processing tool 201 may be a cleaning tool for cleaning the wafer W. A cleaning tape is an example of the cleaning tool. A tape made of nonwoven fabric is an example of the cleaning tape.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate holding apparatus configured to rotate a substrate about its axis while causing the substrate to make a circular motion, comprising:
   rollers capable of contacting a periphery of the substrate;
   electric motors configured to rotate the rollers;
   eccentric shafts arranged around a predetermined central axis; and
   actuators,
   wherein the eccentric shafts have first shaft portions and second shaft portions, the second shaft portions being eccentric relative to the first shaft portions, respectively,
   the rollers are fixed to the second shaft portions, respectively,
   the first shaft portions are coupled to the electric motors, respectively,
   the eccentric shafts include movable shafts and reference shafts,
   the actuators are coupled to the movable shafts, respectively, and the actuators are configured to move the movable shafts independently in different directions closer to the reference shafts and in different directions away from the reference shafts.

2. The substrate holding apparatus according to claim 1, wherein:
the eccentric shafts further have intermediate shaft portions that couple the first shaft portions to the second shaft portions;
the first shaft portions are secured to the intermediate shaft portions, respectively; and
the second shaft portions are secured to the intermediate shaft portions, respectively.

3. The substrate holding apparatus according to claim 1, further comprising an operation controller configured to cause the electric motors to rotate at the same speed with the same phase.

4. The substrate holding apparatus according to claim 1, wherein the direction closer to the reference shafts and the direction away from the reference shafts are a direction toward the central axis and a direction away from the central axis.

5. A substrate holding apparatus configured to rotate a substrate about its axis while causing the substrate to make a circular motion, comprising:
rollers capable of contacting a periphery of the substrate;
electric motors configured to rotate the rollers;
eccentric shafts arranged around a predetermined central axis; and
actuators,
wherein the eccentric shafts have first shaft portions and second shaft portions, the second shaft portions being eccentric relative to the first shaft portions, respectively,
the rollers are fixed to the second shaft portions, respectively,
the first shaft portions are coupled to the electric motors, respectively,
the eccentric shafts include movable shafts and reference shafts,
the actuators are coupled to the movable shafts, respectively, and
the actuators are configured to move the movable shafts in a direction closer to the reference shafts and in a direction away from the reference shafts,
wherein each of the actuators includes:
a piston;
a housing arranged away from the piston; and
a diaphragm which forms a pressure chamber between the piston and the housing,
wherein the diaphragm includes:
a central portion in contact with an end of the piston;
an inner wall portion connected to the central portion and extending along a side surface of the piston;
a folded-back portion connected to the inner wall portion and having a curved cross section; and
an outer wall portion connected to the folded-back portion and located outside the inner wall portion.

6. A substrate holding apparatus configured to rotate a substrate about its axis while causing the substrate to make a circular motion, comprising:
rollers capable of contacting a periphery of the substrate;
electric motors configured to rotate the rollers;
eccentric shafts arranged around a predetermined central axis; and
actuators,
wherein the eccentric shafts have first shaft portions and second shaft portions, the second shaft portions being eccentric relative to the first shaft portions, respectively,
the rollers are fixed to the second shaft portions, respectively,
the first shaft portions are coupled to the electric motors, respectively,
the eccentric shafts include movable shafts and reference shafts,
the actuators are coupled to the movable shafts, respectively, and
the actuators are configured to move the movable shafts in a direction closer to the reference shafts and in a direction away from the reference shafts,
wherein the substrate holding apparatus further comprises:
at least one non-contact type distance sensor configured to measure a movement distance of at least one of the movable shafts; and
an operation controller configured to determine whether or not an abnormality has occurred in the substrate holding apparatus by comparing a measured value of the movement distance or an index value calculated from a plurality of measured values of the movement distance with a preset threshold value.

7. The substrate holding apparatus according to claim 6, wherein the index value is an average value of positions of at least one of the movable shafts when the rollers are making one or more rotations.

8. The substrate holding apparatus according to claim 6, wherein the index value is a difference between a maximum value and a minimum value of positions of at least one of the movable shafts during one or more rotations of the rollers.

9. A substrate holding apparatus configured to rotate a substrate about its axis while causing the substrate to make a circular motion, comprising:
rollers capable of contacting a periphery of the substrate;
electric motors configured to rotate the rollers;
eccentric shafts arranged around a predetermined central axis; and
an actuator,
wherein the eccentric shafts have first shaft portions and second shaft portions, the second shaft portions being eccentric relative to the first shaft portions, respectively,
the rollers are fixed to the second shaft portions, respectively,
the first shaft portions are coupled to the electric motors, respectively,
the eccentric shafts include a movable shaft and reference shafts,
the actuator is coupled to the movable shaft, and
the actuator is configured to move the movable shaft in a direction closer to the reference shafts and in a direction away from the reference shafts, and
wherein the actuator includes:
a piston;
a housing arranged away from the piston; and
a diaphragm which forms a pressure chamber between the piston and the housing,
wherein the diaphragm includes:
a central portion in contact with an end of the piston;
an inner wall portion connected to the central portion and extending along a side surface of the piston;

a folded-back portion connected to the inner wall portion and having a curved cross section; and
an outer wall portion connected to the folded-back portion and located outside the inner wall portion.

10. A substrate holding apparatus configured to rotate a substrate about its axis while causing the substrate to make a circular motion, comprising:
rollers capable of contacting a periphery of the substrate;
electric motors configured to rotate the rollers;
eccentric shafts arranged around a predetermined central axis; and
an actuator,
wherein the eccentric shafts have first shaft portions and second shaft portions, the second shaft portions being eccentric relative to the first shaft portions, respectively,
the rollers are fixed to the second shaft portions, respectively,
the first shaft portions are coupled to the electric motors, respectively,
the eccentric shafts include a movable shaft and reference shafts,
the actuator is coupled to the movable shaft, and
the actuator is configured to move the movable shaft in a direction closer to the reference shafts and in a direction away from the reference shafts, and
wherein the actuator includes:
a piston;
a housing arranged away from the piston; and
a diaphragm which forms a pressure chamber between the piston and the housing,
the substrate holding apparatus further comprises:
a non-contact type distance sensor configured to measure a movement distance of the movable shaft; and
an operation controller configured to determine whether or not an abnormality has occurred in the substrate holding apparatus by comparing a measured value of the movement distance or an index value calculated from a plurality of measured values of the movement distance with a preset threshold value.

11. The substrate holding apparatus according to claim 10, wherein the index value is an average value of positions of the movable shaft when the rollers are making one or more rotations.

12. The substrate holding apparatus according to claim 10, wherein the index value is a difference between a maximum value and a minimum value of positions of the movable shaft during one or more rotations of the rollers.

13. A substrate processing apparatus comprising:
the substrate holding apparatus according to claim 1; and
a processing head configured to bring a processing tool into contact with a first surface of a substrate to process the first surface.

* * * * *